United States Patent

Chou et al.

(10) Patent No.: US 8,974,238 B2
(45) Date of Patent: Mar. 10, 2015

(54) FLIP-COVERED PORTABLE MEMORY STORAGE DEVICE

(75) Inventors: Peter Leekuo Chou, Orange, CA (US); Hsi Ming Tsai, Hsinchu County (TW); Yi Ting Lin, Changhua County (TW); Ming Ching Wang, Hsinchu (TW); Pin Hsien Huang, Hsinchu County (TW)

(73) Assignee: Kingston Technology Corp., Fountain Valley, CA (US)

( * ) Notice: Subject to any disclaimer, the term of this patent is extended or adjusted under 35 U.S.C. 154(b) by 5 days.

(21) Appl. No.: 13/164,706

(22) Filed: Jun. 20, 2011

(65) Prior Publication Data

US 2012/0322281 A1    Dec. 20, 2012

(51) Int. Cl.
| H01R 41/00 | (2006.01) |
| H01R 13/44 | (2006.01) |
| H05K 7/16 | (2006.01) |
| H01R 13/447 | (2006.01) |
| H05K 5/02 | (2006.01) |

(52) U.S. Cl.
CPC ............ *H01R 13/447* (2013.01); *H05K 5/0278* (2013.01); *H01R 13/44* (2013.01); *H05K 7/16* (2013.01); *H01R 41/00* (2013.01)
USPC .......................................... 439/131; 361/725

(58) Field of Classification Search
CPC .... H01R 13/447; H01R 13/44; H05K 5/0278; H05K 7/16
USPC ........... 439/131, 135, 136, 13, 165, 630, 638, 439/946, 521, 149; 361/725, 726, 737, 755, 361/752

See application file for complete search history.

(56) References Cited

U.S. PATENT DOCUMENTS

| 6,890,188 | B1 | 5/2005 | Le | |
| 6,926,544 | B2* | 8/2005 | Lee | 439/147 |
| 7,153,148 | B2* | 12/2006 | Chen et al. | 439/141 |
| 7,198,518 | B1* | 4/2007 | Liou | 439/630 |
| 7,466,556 | B2* | 12/2008 | Hiew et al. | 361/737 |
| 7,568,942 | B1* | 8/2009 | Lannon et al. | 439/521 |
| 7,699,630 | B2* | 4/2010 | Kim | 439/136 |
| 7,713,074 | B2* | 5/2010 | Poo et al. | 439/136 |
| 7,744,387 | B2* | 6/2010 | Yu et al. | 439/136 |
| 2003/0223286 | A1* | 12/2003 | Lee | 365/200 |
| 2005/0079738 | A1* | 4/2005 | Ahn | 439/1 |
| 2005/0186818 | A1* | 8/2005 | Yano et al. | 439/165 |
| 2007/0171620 | A1* | 7/2007 | Lee | 361/737 |
| 2008/0019090 | A1* | 1/2008 | Zhu et al. | 361/684 |
| 2008/0026614 | A1* | 1/2008 | Emerson et al. | 439/136 |
| 2008/0288697 | A1* | 11/2008 | Kim | 710/300 |
| 2010/0075517 | A1* | 3/2010 | Ni et al. | 439/131 |
| 2010/0304586 | A1* | 12/2010 | Ma | 439/131 |
| 2011/0237099 | A1* | 9/2011 | Ni et al. | 439/142 |

* cited by examiner

*Primary Examiner* — Abdullah Riyami
*Assistant Examiner* — Harshad Patel
(74) *Attorney, Agent, or Firm* — Law Office of S.J. Christine Yang

(57) ABSTRACT

A portable memory storage device with a miniaturized memory storage assembly package with electrical contacts that further includes a casing, the casing holding the memory package and having a first end portion, a cover, the cover being rotatable about the first end portion of the casing, and at least a plug for engaging the cover and the casing and being fitted about the first end portion of the casing. When the cover is rotated about the first end portion of the casing to selectively cover or expose the electrical contacts, the plug rotates about the first end portion with the cover. Further, the first end portion includes a groove on an interior side surface, and when the cover is at a first locked state, a projection of the plug abuts against a side of the groove. The electrical contacts can be formed in accordance with the USB Specification.

17 Claims, 4 Drawing Sheets

FLIP-COVERED PORTABLE MEMORY STORAGE DEVICE

BACKGROUND OF THE INVENTION

1. Field of the Invention

The present invention relates generally to portable memory devices and, more specifically, to a flip-covered System-in-Package ("SiP") memory storage device that has a miniaturized flash memory.

2. Discussion of the Related Art

Portable memory storage devices, such as memory devices with Universal Serial Bus ("USB") connectors, are increasingly utilized to portably transfer electronic data. One type of the portable data storage devices is commonly referred to as USB memory device, which have ergonomically-sized housing that could be easily handled in a user's hand.

FIG. 1 is a perspective view of a USB memory device according to the related art. In FIG. 1, a USB memory device 10 has a casing 12 including an upper half casing 13 and a lower half casing 14. At the forward end of the USB memory device 10, a male USB connector 11 projects out from the casing 12.

The male USB connector 11 at the forward end of the thumb drive 10 is electrically connected to the circuitry of a Printed Circuit Board Assembly ("PCBA") housed within the casing 12 by means of soldering and permanently secured to the PCBA by soldering or other methods known in the art. The male USB connector 11 is a male USB connector with electrical contacts built within a metallic casing with a front opening and two apertures on an upper surface. Dimensions of the electrical contacts, casing and apertures are standardized and governed by the USB Specification.

The USB memory device 10 can be connected to a USB port in a laptop computer, desktop computer, peripheral device, or any other USB-compatible machine or device. The USB memory device 10 is small enough to fit easily in a user's pocket and is useful for portable storage of data. The casing 12 of the USB memory device 10 is a convenient size for a human hand. It is not so large that it is bulky, and it is not so small that it is hard to handle and use.

Recently, miniaturized memory assemblies have appeared which replace the conventional PCBAs. These new assemblies incorporate memory storage, controller, and other necessary circuitry in a very small package, sometimes referred to as "System-in-Package", or "SiP". A SiP device can be a complete functional unit by itself in one multi-chip package and include appropriate electrical contacts for connection. The size of these SiP devices could be customized but generally very small. For example, a SiP device could be no thicker than a penny and less than about an inch or 2.5 cm in length. SiP memory devices generally are not much larger than the conventional male USB connector necessary for connecting the device to a USB port of a laptop or similar machine. But, the electrical contacts of the small SiP memory devices are exposed and unprotected.

Therefore, what is needed is a protective structure for a miniaturized memory device, such as a SiP memory device, as well as making it easier for the user to handle and less likely to be lost when carried. Also needed is a miniaturized memory device with a protective cover of the chip package and electrical contacts while easily exposing the electrical contacts for connecting the memory device to a USB port of another device.

SUMMARY OF THE INVENTION

Accordingly, embodiments of the invention are directed to a portable memory device that substantially obviates one or more of the problems due to limitations and disadvantages of the related art.

An object of embodiments of the invention is to provide a USB memory device that includes a very small memory package, such as a "System-in-Package" or "SiP" memory device.

Another object of embodiments of the invention is to provide a flip-covered USB memory device that includes a very small memory package, such as a "System-in-Package" or "SiP" memory device, and easily exposes electrical contacts for connecting the memory device to a USB port of another device.

Another object of embodiments of the invention is to provide a USB memory device that includes a very small memory package, such as a "System-in-Package" or "SiP" memory device, and a cover that can be locked into a close position and a open position to selectively expose electrical contacts for connecting the memory device to a USB port of another device.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a device includes a memory, the memory including electrical contacts, a casing, the casing holding the memory and having a first end portion, a cover, the cover being rotatable about the first end portion of the casing, and at least a plug for engaging the cover and the casing and being fitted about the first end portion of the casing, wherein the cover is rotatable about the first end portion of the casing to selectively cover or expose the electrical contacts.

In another aspect, a device includes a memory, the memory including electrical contacts, a casing, the casing holding the memory and having a first end portion, a cover, the cover being rotatable about the first end portion of the casing, and at least a plug for engaging the cover and the casing and being fitted about the first end portion of the casing, wherein the cover is rotatable about the first end portion of the casing to selectively cover or expose the electrical contacts and wherein when the cover rotates about the first end portion of the casing, the plug rotates about the first end portion with the cover.

In another aspect, a device includes a memory, the memory including electrical contacts, a casing, the casing holding the memory and having a first end portion, a cover, the cover being rotatable about the first end portion of the casing, and at least a plug for engaging the cover and the casing and being fitted about the first end portion of the casing, wherein the cover is rotatable about the first end portion of the casing to selectively cover or expose the electrical contacts and wherein when the cover is at a first locked state, the cover exposing the electrical contacts.

In yet another aspect, a device includes a memory, the memory including electrical contacts, a casing, the casing holding the memory and having a first end portion, a cover, the cover being rotatable about the first end portion of the casing, and at least a plug for engaging the cover and the casing and being fitted about the first end portion of the casing, wherein the cover is rotatable about the first end portion of the casing to selectively cover or expose the electrical contacts, the first end portion includes a groove on an interior side surface, when the cover rotates about the first end portion of the casing, the plug rotates about the first end portion with the cover, and when the cover is at a first locked state, a projection of the plug abuts against a side surface of the groove.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
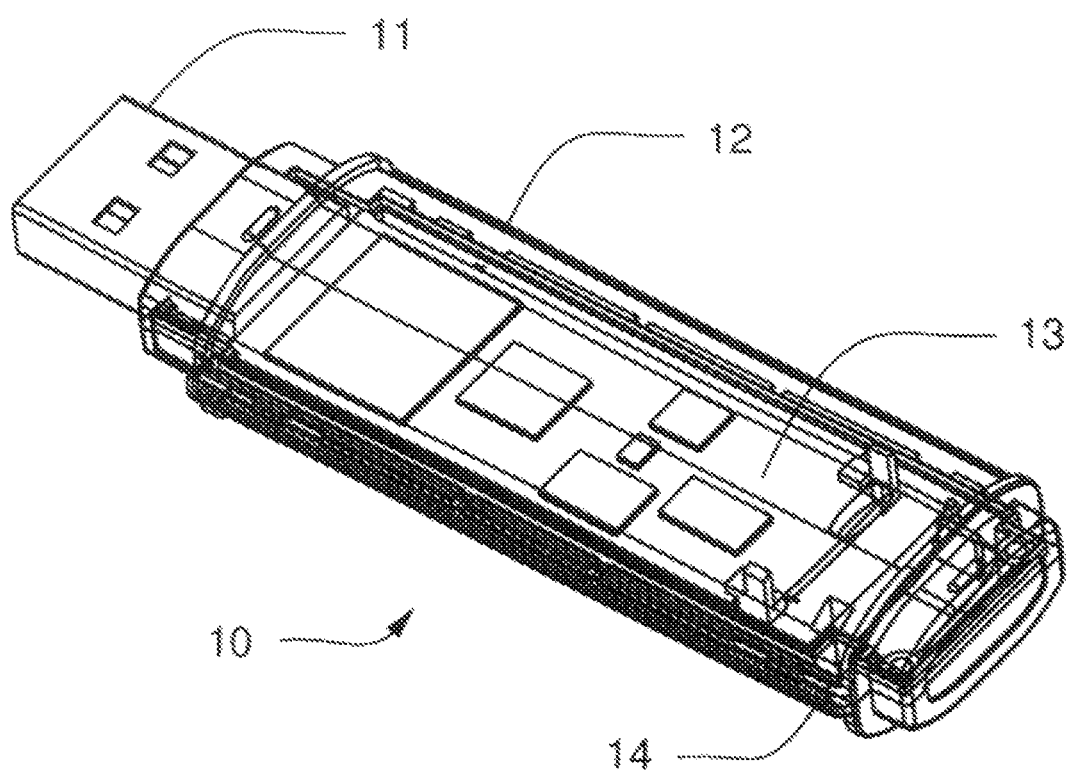
FIG. 1 is a perspective view of a USB memory device according to the related art.
Figure 2:
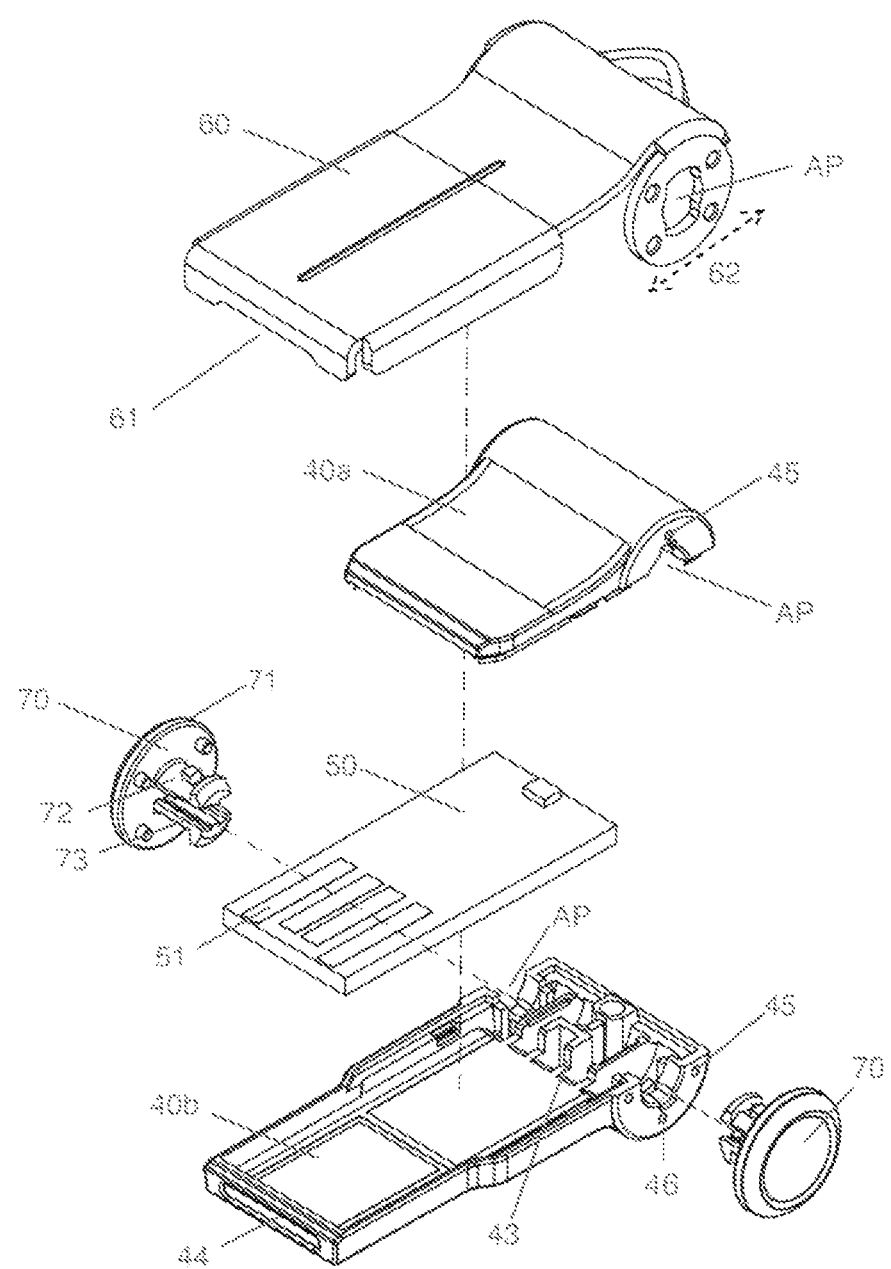
FIG. 2 is a perspective view of a memory storage device in a disassembled state according to an embodiment of the present invention.

FIG. 2 is a perspective view of a memory storage device in a disassembled state according to an embodiment of the present invention. In FIG. 2, a portable memory storage device 20 includes a top casing half 40a and a bottom casing half 40b. The top and bottom casing halves 40a and 40b have a first round or circular end portion and a second end portion. The top and bottom casing halves 40a and 40b may have different lengths. When assembled together, the top and bottom casing halves 40a and 40b form a mouth at a second end portion of the bottom casing half 40b.

The bottom casing half 40b supports a miniaturized memory storage assembly package or PCBA 50 with electrical contacts 51. The memory storage package or PCBA 50 includes flash memories and the electrical contacts correspond or satisfy the USB Specification. The electrical contacts 51 remain exposed through the mouth of the casing, when the top and bottom casing halves 40a and 40b substantially house other surfaces of the memory storage package 50. Ribs 43 can be formed on interior surfaces of the circular end portion of the casing to provide a positive mechanical fixture to restrict the memory storage package 50 in place within the bottom casing half 40b. A recess 44 can be formed on a side surface of another end of the bottom casing half 40b. The recess 44 can provide one of the positive structures for a user to handle the memory storage package 50.

The portable memory storage device 20 also includes a cover 60. The cover 60 may be just a slightly larger than the bottom casing half 40b, such that the cover 60 covers over the top casing half 40a and around the two long-side surfaces of the bottom casing half 40b. The cover 60 is rotatable about the first end portion of the top and bottom casing halves 40a and 40b. In particular, the cover 60 could be flipped and selectively expose or cover the electrical contacts 51.

The cover 60 also includes a first round or circular end portion 62. The first end portion 62 of the cover 60 may shape similarly as the first end portion of the casing. For example, an aperture AP may be in the first end portion 62 of the cover 60 and the first end portion of the top and bottom casing halves 40a and 40b.

According to an embodiment of the present invention, the portable memory storage device 20 further includes a plug 70. The plug 70 includes a flange 71, a first prong 72 and a second prong 73. The flange 71 may include a raised top or inscription formed on an outer surface. The first prong 72 and the second prong 73 respectively protrude from an inner surface of the plug 70. The first prong 72 and the second prong 73 can fit through the aperture AP. Each of the first prong 72 and the second prong 73 may have an expanded end portion, such that after the plug 70 is inserted through the aperture AP, the end portions of the first and second prongs 72 and 73 abut against an inner surface of the bottom casing half 40b and prevents the plug 70 from disengaged from the portable memory storage device 20.

According to an embodiment of the present invention, as the cover 60 is rotated about the first end portion of the casing, the plug 70 also rotates about the first end portion of the casing with the cover 60. In particular, the cover 60 can have at least one locked open state and can be rotated into the locked open state. For example, one of the first prong 72 and the second prong 73 further includes a projection 72a. As the cover 60 and the plug 70 rotate, the projection 72a eventually abuts against an end of a groove 46 formed in the side of the aperture AP of the bottom casing half 40b and the cover 60 comes to the locked open state. The projection 72a can also induce friction against side surface along the path between the lock states to prevent loose swivel.

Figure 3:
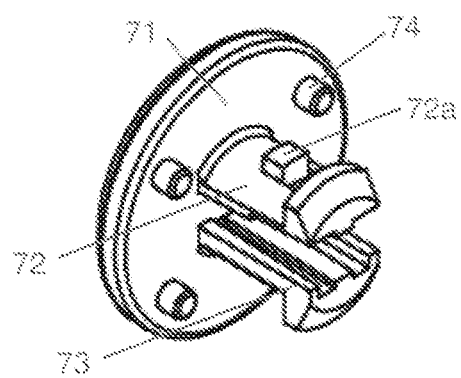
FIG. 3 is a perspective view of a plug for a memory storage device according to an embodiment of the present invention.

FIG. 3 is a perspective view of a plug for a memory storage device according to an embodiment of the present invention. As shown in FIG. 3, one or more mini posts 74 may be formed on the inner surface of the plug 70. When the plug 70 is engaged within the portable memory storage device 20, the mini posts 74 may fit into corresponding openings on the cover 60 (shown in FIG. 2).

Figure 4:
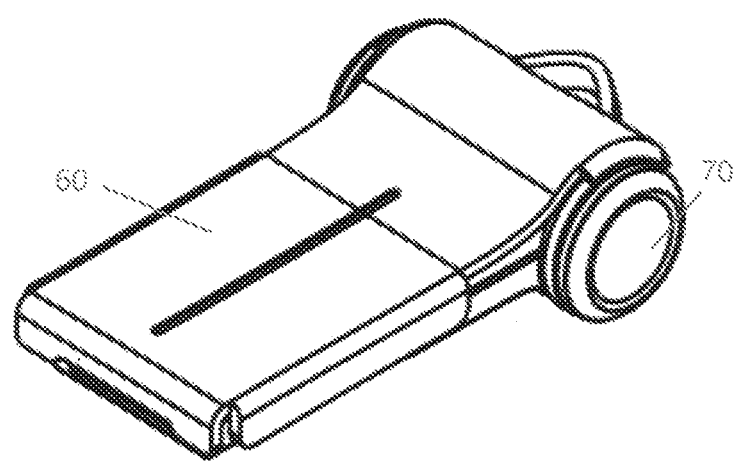
FIG. 4 is a perspective view of a memory storage device with a flip cover at a closed state according to an embodiment of the present invention.

FIG. 4 is a perspective view of a memory storage device with a flip cover at a closed state according to an embodiment of the present invention. As shown in FIG. 4, the cover 60 may include a notch 61 in a second end portion, such that the recess 44 of the bottom casing half 40b remains exposed even when the cover 60 is in a closed state. In addition, when the cover 60 is in the closed state, the cover 60 covers the electrical contacts 51 (shown in FIG. 2), the upper surface of the top casing half 40a (shown in FIG. 2), and at least some portions of the side surfaces of the bottom casing half 40b (shown in FIG. 2).

Figure 5:
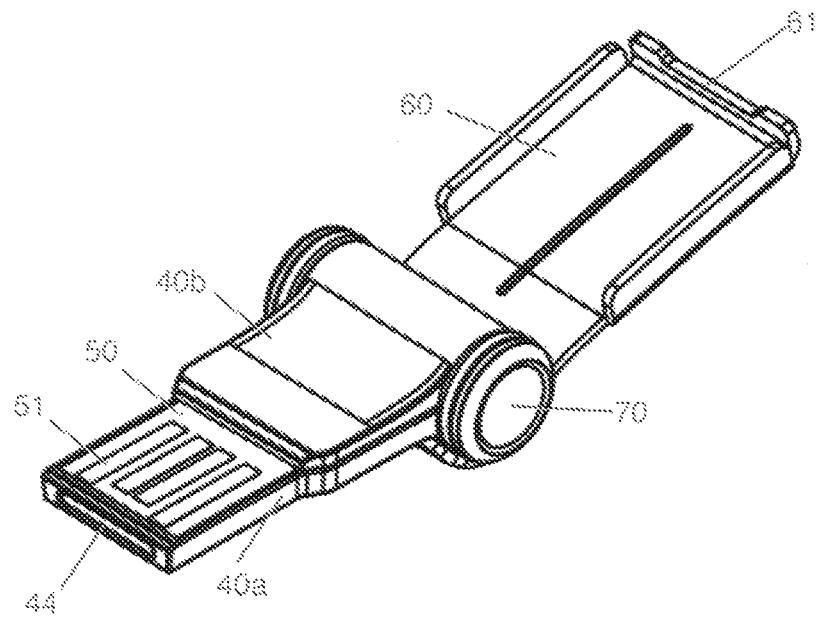
FIG. 5 is a perspective view of the memory storage device with the flip cover at an open state according to an embodiment of the present invention.

FIG. 5 is a perspective view of the memory storage device with the flip cover at an open state according to an embodiment of the present invention. As shown in FIG. 5, when the cover 60 in the locked open state, the cover 60 exposes the electrical contacts 51.

As shown in FIG. 2, the top casing half 40a and the bottom casing half 40b may include raised portions 45 on side surfaces. As the cover 60 rotates about the first end portion of the casing, the raised portions 45 buffers between the casing and the cover 60, thereby providing longer product life for the portable memory storage device 20.

Further, the cover 60, the top casing half 40a, the bottom casing half 40b and the plug 70 may be formed of different materials. For example, the cover 60 may be formed of a metallic material, while the top casing half 40a, the bottom casing half 40b and the plug 70 may be formed of a resin material.

The top casing half 40a and the bottom casing half 40b may be assembled together with an adhesive to hold the memory storage package 50 therein. When assembled, a user may expose the electrical contacts 51 of the memory storage package 50 by flipping the cover 60 away from the top and bottom casing halves 40a and 40b. Alternatively or in addition, a user may expose the electrical contacts 51 of the memory storage package 50 by holding the top and bottom casing halves 40a and 40b away from the cover 60. The user may hold down the top and bottom casing halves 40a and 40b by accessing the recess 44 on the side of the bottom casing half 40b.

The portable memory storage device according to an embodiment of the present invention provides a protective casing for a miniaturized memory storage package such as SiP memory package. The portable memory storage device provides rigid framework and a flip cover that selectively expose electrical contacts of the miniaturized memory storage package. The flip cover can rotate about an end portion of the casing. In addition, the flip cover of the portable memory storage device can have a locked open state. Further, the casing can have raised portions to buffer between the cover and the casing as the cover rotates about an end portion of the casing.

It will be apparent to those skilled in the art that various modifications and variations can be made in the chassis structure of embodiments of the invention without departing from the spirit or scope of the invention. Thus, it is intended that embodiments of the invention cover the modifications and variations of this invention provided they come within the scope of the appended claims and their equivalents.

What is claimed is:

1. A device, comprising:
   a memory, the memory including electrical contacts;
   a casing, the casing holding the memory and having a first portion and a groove on an interior side surface;
   a cover, the cover; and
   at least a plug for engaging the cover and the casing and being fitted about the first end portion of the casing, the plug including a projection,
   wherein the cover is rotatable about the first portion of the casing to selectively cover or expose the electrical contacts; and,
   wherein when the cover rotates about the first portion of the casing, the plug rotates about the first portion with the cover, and the projection of the plug abuts against a side surface of the groove when the cover is at a first locked open state.

2. The device according to claim 1, wherein when the cover is at the first locked open state, the cover exposes the electrical contacts.

3. The device according to claim 1, wherein the plug includes a flange and a first prong extending from one side of the flange.

4. The device according to claim 3, wherein the first prong includes an expanded end portion, the expanded end portion being abutted against a surface of the casing when the plug is fitted about the first end portion of the casing.

5. The device according to claim 4, wherein the expanded end portion of the first prong is step-like.

6. The device according to claim 4, wherein the projection is located on the first prong.

7. The device according to claim 6, wherein the plug further includes a second prong extending from the flange, the second prong located opposing from the first prong.

8. The device according to claim 7, wherein the second prong includes an expanded end portion, the expanded end portion being abutted against a surface of the casing when the plug is fitted about the first portion of the casing.

9. The device according to claim 3, wherein the plug includes a second prong extending from the flange, the second prong located opposing from the first prong.

10. The device according to claim 9, wherein the second prong includes an expanded end portion, the expanded end portion being abutted against a surface of the casing when the plug is fitted about the first portion of the casing.

11. The device according to claim 3, wherein the flange of the plug includes at least one post on a first surface for engaging the cover.

12. The device according to claim 1, wherein the casing includes a second end portion, the second end portion having a recess.

13. The device according to claim 12, wherein when the cover covers the electrical contacts, the cover does not cover the recess of the second end portion of the casing.

14. The device according to claim 1, wherein the casing includes at least one bump on a side surface of the first end portion.

15. The device according to claim 1, wherein the casing includes at least one rib on an internal surface in the first end portion, the memory abutting the rib when the memory is held by the casing.

16. A device, comprising:
   a memory, the memory including electrical contacts;
   a casing, the casing holding the memory and having a first end portion
   and a groove on an interior side surface,
   a cover, the cover being rotatable about the first end portion of the casing; and
   at least a plug for engaging the cover and the casing and being fitted about the first end portion of the casing, the plug including a flange, a first prong extending from one side of the flange, and a projection on the first prong, wherein the first prong includes an expanded end portion, the expanded end portion being abutted against a surface of the casing when the plug is fitted about the first end portion of the casing,
   wherein the cover is rotatable about the first end portion of the casing to selectively cover or expose the electrical contacts; and,
   when the cover rotates about the first end portion of the casing, the plug rotates about the first end portion with the cover, and the projection abuts against a side surface of the groove when the cover reaches a first locked open state.

17. A device, comprising:
   a memory, the memory including electrical contacts:
   a casing, the casing holding the memory and having a first end portion;
   a cover, the cover being rotatable about the first end portion of the casing; and
   at least a plug for engaging the cover and the casing and being fitted about the first end portion of the casing,
   wherein the cover is rotatable about the first end portion of the casing to selectively cover or expose the electrical contacts;

wherein when the cover includes at least a first locked open state, and when the cover is at the first locked open state, the cover exposes the electrical contacts;

wherein the plug includes a flange and a first prong extending from one side of the flange, the first prong including an expanded end portion and the expanded end portion being abutted against a surface of the casing when the plug is fitted about the first end portion of the casing; and, wherein the first prong includes a projection, the first end portion includes a groove on an interior side surface, and when the cover rotates about the first end portion of the casing, the plug rotates with the cover about the first end portion, and the projection abuts against a side surface of the groove.

* * * * *